United States Patent [19]
Kurz

[11] Patent Number: 5,386,340
[45] Date of Patent: Jan. 31, 1995

[54] ENCLOSURE FOR PERSONAL COMPUTER CARD GPT

[76] Inventor: Arthur A. Kurz, Wildlife Run, New Vernon, N.J. 07976

[21] Appl. No.: 106,210

[22] Filed: Aug. 13, 1993

[51] Int. Cl.⁶ .......................... H05K 5/03; H05K 9/00
[52] U.S. Cl. .................................. 361/737; 206/334; 220/4.24; 235/492; 361/818
[58] Field of Search ................... 220/4.22, 4.23, 4.24, 220/4.02; 174/35 R; 235/487, 492; 439/76, 607; 200/303; 206/332, 328, 334, 449; 361/684, 728, 736, 737, 752, 800, 816, 818

[56] References Cited

U.S. PATENT DOCUMENTS

| | | |
|---|---|---|
| 1,288,396 | 12/1918 | Duncan . |
| 1,951,596 | 3/1934 | Creesy . |
| 3,372,310 | 3/1968 | Kantor . |
| 3,721,746 | 3/1973 | Knappenberger .............. 174/35 MS |
| 4,568,824 | 2/1986 | Gareis et al. . |
| 4,700,840 | 10/1987 | Haddock . |
| 4,727,246 | 2/1988 | Hara et al. . |
| 4,758,689 | 7/1988 | Nakao et al. . |
| 4,868,713 | 9/1989 | Banjo .................................. 361/392 |
| 4,890,197 | 12/1989 | Banjo et al. . |
| 4,918,299 | 4/1990 | Ohmori . |
| 4,931,623 | 6/1990 | Nakamura et al. . |
| 5,017,767 | 5/1991 | Mizuno . |
| 5,038,250 | 8/1991 | Uenaka ................................. 361/395 |
| 5,111,362 | 5/1992 | Flamm ................................. 361/395 |
| 5,242,310 | 9/1993 | Leung ................................. 361/737 |
| 5,310,213 | 5/1994 | Mori ................................. 220/4.23 |

FOREIGN PATENT DOCUMENTS

| | | |
|---|---|---|
| 0375925 | 7/1990 | European Pat. Off. ........... 220/4.22 |
| 0451774 | 10/1991 | European Pat. Off. ........... 220/4.23 |
| 5173840 | 12/1992 | Japan . |

OTHER PUBLICATIONS

AMP Catalog 65701, Memory Card/PC Card Connectors, p. 20, Frame Kits, Type II, Unshielded, Issued Jul. 1993.

*Primary Examiner*—Gerald P. Tolin
*Attorney, Agent, or Firm*—Samuelson & Jacob

[57] ABSTRACT

An enclosure for a personal computer card is constructed of a single sheet of material folded into confronting upper and lower enclosure members secured together in the confronting arrangement by nested side walls and channels formed along peripheral edges of the enclosure members to house an electronic device within the enclosure.

14 Claims, 2 Drawing Sheets

ENCLOSURE FOR PERSONAL COMPUTER CARD GPT

The present invention relates generally to personal computer cards and pertains, more specifically, to personal computer cards in which an electronic device is housed within an enclosure for convenient interconnection with a personal computer, and to a method for making such personal computer cards.

The increasing popularity of small portable computers, such as notebooks and hand-held computer systems, has given rise to the requirement for smaller, more compact devices, such as electronic memory devices, capable of use in connection with these computers. Personal computer cards, known as PC Cards, have been developed for adding memory, storage and input-/output capabilities to such small portable computer systems. PC Cards are about the size and shape of a standard credit card and provide a wide variety of increased capabilities to host apparatus, such as laptops, notebooks, palmtops, tablets and other portable computing systems, equipped with a slot for receiving a PC Card.

The overall structure of a PC Card includes an enclosure within which there is housed an electronic device, which device usually includes electronic components mounted upon a circuit board, a power source, such as a battery, and connectors for enabling interconnection with a portable computing system, as well as for providing input/output capabilities. The enclosure usually is constructed of steel, preferably stainless steel, for strength and rigidity, so as to maintain the structural integrity and dimensional stability required in a PC Card, as well as for providing an effective electrically conductive shielding envelope for the electronic device housed within the enclosure.

The present invention provides an enclosure for personal computer cards, and a method for making a so-enclosed personal computer card, and attains several objects and advantages, some of which are summarized as follows: Enables the economical manufacture of effectively enclosed personal computer cards; provides PC Card enclosures of accurate dimensions, and requisite strength and rigidity to maintain structural integrity and dimensional stability throughout an extended service life; simplifies the assembly and completion of PC Cards; provides added flexibility in the design and construction of PC Cards for enhanced information storage and processing capabilities; accommodates a wide variety of PC Card configurations while providing enhanced strength, rigidity and electrical shielding integrity; facilitates high speed production and assembly techniques for the economical manufacture of PC Cards in large numbers of consistent high quality.

The above objects and advantages, as well as further objects and advantages, are attained by the present invention, which may be described briefly as an enclosure for a personal computer card in which an electronic device is housed within the enclosure for convenient interconnection with a host apparatus, the personal computer card having a generally rectangular plan configuration including longitudinal sides and lateral ends, and a predetermined thickness, the enclosure comprising: first and second shell-like members, each shell-like member having a generally rectangular plan configuration and including a panel, longitudinal side edges corresponding to the longitudinal sides of the personal computer card, and lateral end edges corresponding to the lateral ends of the personal computer card; channels integral with the panel of at least the second shell-like member and extending longitudinally along the longitudinal side edges of the second shell-like member, the channels having an external channel width extending altitudinally and corresponding to the thickness of the personal computer card, and an internal channel width; and side walls integral with the panel of at least the first shell-like member and extending longitudinally along the longitudinal side edge of the first shell-like member, the side walls having a side wall width extending altitudinally; the relative dimensions and locations of the internal channel width and the side wall width being such that upon juxtaposition of the first and second shell-like members in opposed arrangement, the panels confront one another and the side walls of the first shell-like member are nested within the corresponding channels of the second shell-like member to secure the first and second shell-like members together with the respective panels opposed to one another and spaced apart to accommodate the electronic device between the opposed panels. In addition, the invention includes an improvement in a method for making a personal computer card in which an electronic device is housed within an enclosure for convenient interconnection with a personal computer, the personal computer card having a generally rectangular plan configuration including longitudinal sides and lateral ends, and a predetermined thickness, the improvement comprising the steps of: forming first and second enclosure members, with each enclosure member having a generally rectangular plan configuration and including a panel, longitudinal side edges corresponding to the longitudinal sides of the personal computer card, and lateral end edges corresponding to the lateral ends of the personal computer card; forming side walls integral with the panel of at least the first enclosure member and extending longitudinally along the longitudinal side edges of the first enclosure member, the side walls having a side wall width extending altitudinally; forming channels integral with the panel of at least the second enclosure member and extending longitudinally along the longitudinal side edges of the second enclosure member, the channels having an external channel width extending altitudinally and corresponding to the thickness of the personal computer card, and an internal channel width; and juxtaposing the first and second enclosure members in opposed arrangement with the panels confronting one another and with the side walls of the first enclosure member nested within corresponding channels of the second enclosure member to secure the first and second enclosure members together with the respective panels opposed to one another and spaced apart to accommodate the electronic device between the opposed panels.

The invention will be understood more fully, while still further objects and advantages will become apparent, in the following detailed description of preferred embodiments of the invention illustrated in the accompanying drawing, in which.

Figure 1:
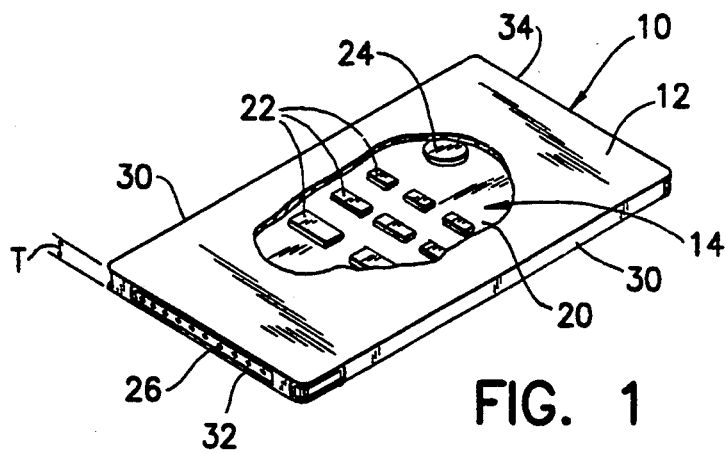
FIG. 1 is a perspective view of a personal computer card constructed in accordance with the present invention, with portions cut away for illustrative purposes.

Referring now to the drawing, and especially to FIG. 1 thereof, a personal computer card is shown in the form of PC Card 10 constructed in accordance with the present invention and including an enclosure 12 housing an electronic device 14 having a circuit board 20 upon which is mounted a plurality of electronic components 22, in a manner now well known in the construction of electronic devices, a power source in the form of a battery 24, and a connector 26. Enclosure 12 houses the electronic device 14, including the circuit board 20, the battery 24 and the connector 26, and provides a relatively high strength, rigid housing for the PC Card 10, while at the same time serving as an electrically conductive shielding envelope necessary for the proper operation of the PC Card 10. PC Card 10 has a generally rectangular plan configuration with a periphery including longitudinal sides 30 of prescribed length and lateral ends 32 and 34 of given width, and has a predetermined thickness along the longitudinal sides 30 and the lateral ends 32 and 34.

Figure 2:
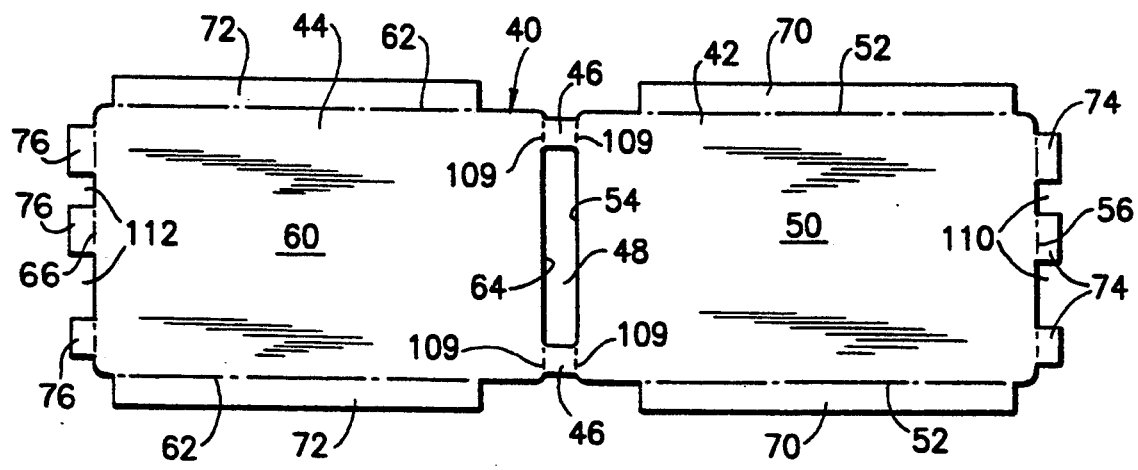
FIG. 2 is a plan view of a blank for the enclosure of the personal computer card.

Turning now to FIG. 2, enclosure 12 is constructed from a blank 40 stamped from a sheet of metal, preferably stainless steel, in a unitary, one-piece construction. Blank 40 includes first and second enclosure members 42 and 44 joined together by bridges 46 which define an opening 48 between the first enclosure member 42 and the second enclosure member 44. First enclosure member 42 has a generally rectangular plan configuration and includes a panel 50 having a periphery which includes longitudinal side edges 52, corresponding to the longitudinal sides 30 of the PC Card 10, and lateral end edges 54 and 56 corresponding respectively to the lateral ends 32 and 34 of the PC Card 10. Likewise, second enclosure member 44 has a generally rectangular plan configuration and includes a panel 60 having a periphery which includes longitudinal side edges 62, corresponding to the longitudinal sides 30 of the PC Card 10, and lateral end edges 64 and 66, corresponding respectively to the lateral ends 32 and 34 of the PC Card 10. Side wall tabs 70 are unitary with panel 50 along longitudinal side edges 52, and side wall tabs 72 are unitary with panel 60 along longitudinal side edges 62. In a similar manner, end wall tabs 74 are unitary with panel 50 along lateral end edge 56, and end wall tabs 76 are unitary with panel 60 along lateral end edge 66, for purposes which will be set forth in detail below.

Figure 3:
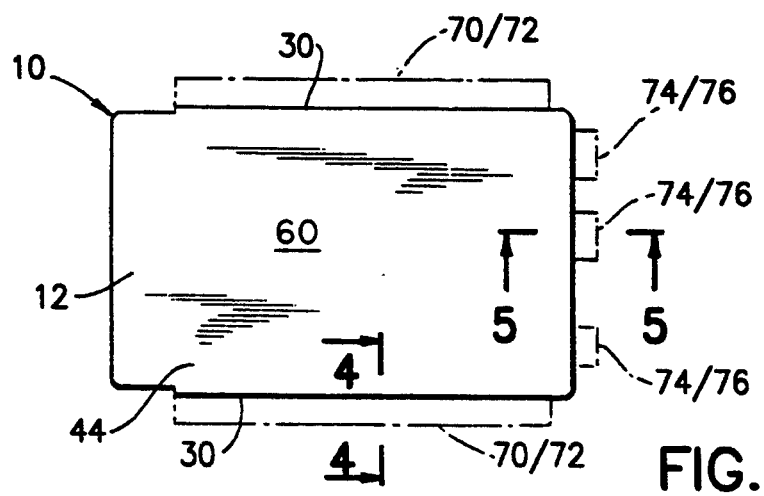
FIG. 3 is a plan view of the personal computer card, with portions shown in phantom to illustrate steps in the improved method of the present invention.
Figure 4:
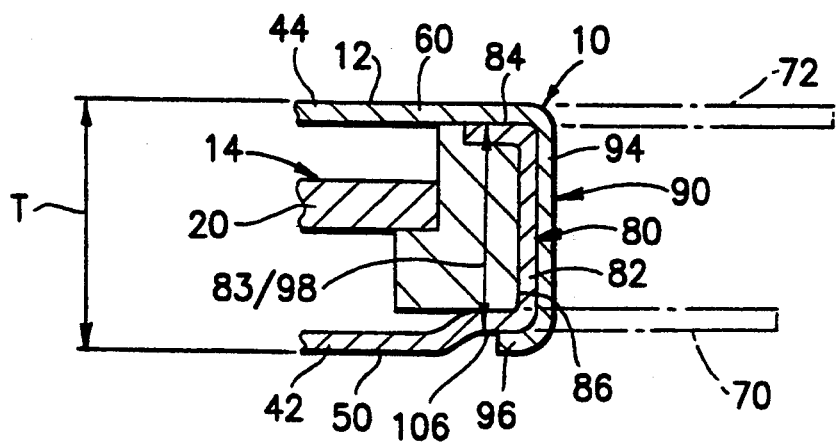
FIG. 4 is an enlarged fragmentary cross-sectional view taken along line 4—4 of FIG. 3.
Figure 5:
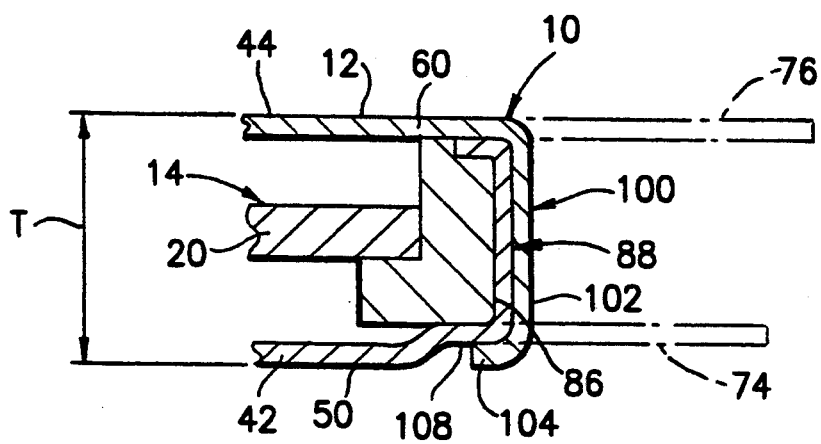
FIG. 5 is an enlarged fragmentary cross-sectional view taken along line 5—5 of FIG. 3.

In one preferred embodiment of the construction of PC Card 10, the side wall tabs 70 are formed, as by bending, as indicated in phantom in FIGS. 3 and 4, preferably into a channel 80, the electronic device 14 is placed upon the first enclosure member 42 and located between the opposite channels 80. Each channel 80 includes a side wall 82 having an altitudinally extending side wall width, shown in the form of external channel width 83, and a flange 84 placed along a corresponding portion of a frame 86 within which the circuit board 20 is seated to capture the frame 86 and circuit board 20 and hold the electronic device 14 in place within a shell-like configuration established in the first enclosure member 42. In a similar manner, end wall tabs 74 of the first enclosure member 42 are formed into channels 88, as indicated in phantom in FIGS. 3 and 5, which channels 88 are placed along a corresponding portion of frame 86. Side wall tabs 72 of the second enclosure member 44 are formed into channels 90, as indicated in phantom in FIGS. 3 and 4, which channels 90 include a side wall 94 and a flange 96. Channels 90 have an internal channel width 98 complementary to the external channel width 83 of each corresponding channel 80 so that the relative dimensions, in particular, the altitudinal distance over which external channel width 83 extends and the altitudinal distance over which internal channel width 98 extends, and the relative locations of the channels 80 and 90 assure that channels 80 are nested and secured within corresponding channels 90. Further, channels 90 have an external channel width corresponding to the thickness T of PC Card 10. In a similar manner, end wall tabs 76 are formed into channels 100 having side walls 102 and flanges 104, within which channels 100 are nested corresponding channels 88. Thus, the shell-like configuration established in the second enclosure member 44 is secured to the shell-like configuration of the first enclosure member 42 and the electronic device 14 is enveloped within enclosure 12 between the first and second enclosure members 42 and 44. It is noted that channels 80 and 88 each are offset from the panel 50 of the first enclosure member 42 at 106 and at 108, respectively, so that the flanges 96 and 104 are seated within the respective offsets 106 and 108 to accommodate flanges 96 and 104 within the overall thickness between the opposed panels 50 and 60 of juxtaposed first and second enclosure members 42 and 44.

First and second enclosure members 42 and 44 are juxtaposed with one another, as seen in FIG. 3, by folding blank 40 so that the first and second enclosure members 42 and 44 become lower and upper shell-like members, respectively, of enclosure 12. Such folding is accomplished about fold lines 109 which define the length of the bridges 46 and, hence, the thickness T of the PC Card 10 at the lateral end 32. The opening 48 between the bridges 46 establishes the necessary access to the connector 26 of the electronic device 14 so that upon insertion of the inner end 32 of the PC Card 10 into the appropriate slot in a host apparatus, such as a personal computer or the like, the PC Card 10 is connected to the host device for proper operation. The tabs 74 and 76 at the respective lateral end edges 56 and 66 of the first and second members 42 and 44 are arranged along the lateral end edges 56 and 66 so as to provide spaces 110 and 112 at predetermined locations along the respective lateral end edges 56 and 66. These spaces 110 and 112 are located so as to accommodate the various configurations required for the selected input/output interconnection at the end 34 of the PC Card 10. Thus, PC Card 10 is selectively constructed to accept modem connections, network connections, printer connections, and other peripherals, as well as various extensions ordinarily added to the input/output end of the PC Card 10.

Since the forming of the blank 40 is accomplished by stamping in highly accurate die sets, and since the formation of the channels 80 and 90 likewise is accomplished in accurately dimensioned tools, the dimensions of the PC Card enclosure 12 are held to very close tolerances, enabling the attainment of an exceptionally high degree of accuracy with relative ease and economy. The construction which utilizes nested channels, especially along the longitudinal sides 30 of the PC Card 10, provides enhanced rigidity for resisting bending, twisting and other distortions during use, thereby accomplishing exemplary dimensional stability while affording maximum protection to the internal components of the PC Card. In addition, the nested channels 80 and 90, as well as the nested channels 88 and 100, provide electrical continuity for enabling a high degree of electrical integrity in the shielding arrangement established by the enclosure 12. In addition, the integral metal construction of enclosure 12, including the nested edges of the shell-like first and second enclosure members 42 and 44, provides for enhanced grounding connections between the enclosure 12 and the host apparatus. The improved method of construction lends itself to relatively high speed production and assembly techniques for economical manufacture.

In the preferred method, the channels 90 and 100 are formed prior to juxtaposition of the first and second enclosure members 42 and 44 so that upon folding the first and second enclosure members 42 and 44 into opposed juxtaposition with one another, the channels 90 and 100 merely are snapped over corresponding channels 80 and 88 to complete the assembly of the PC Card 10. In an alternate method, the channels 90 and 100 are formed after the first and second enclosure members 42 and 44 are folded into juxtaposition with one another. The electronic device 14 is placed within the first enclosure member 42 prior to juxtaposition of the first and second enclosure members 42 and 44 so that assembly is complete merely by folding the blank 40, as described. In this manner, final assembly of the PC Card 10 is accomplished without the requirement for extensive special tools or skills, and requires no fasteners, adhesives, welding or other time-consuming or intricate joining procedures or systems for the completion of a reliable PC Card 10. Again, the accuracy with which the channels 80, 90, 88 and 100 are formed enables the achievement of closely controlled dimensions in the completed PC Card, with ease of manufacture.

Figure 6:
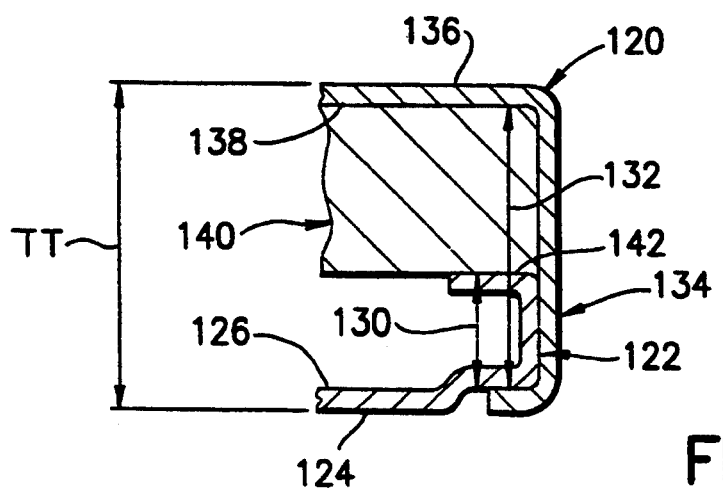
FIG. 6 is an enlarged fragmentary cross-sectional view similar to FIG. 4, and showing an alternate construction.

Turning now to FIG. 6, another embodiment of the invention is illustrated in the form of PC Card 120 which has a thickness TT greater than the thickness T of the PC Card 10 described above. In the present embodiment, channel 122 along the panel 124 of the lower enclosure member 126 has an external channel width 130 which is less than the internal channel width 132 of channel 134 along the panel 136 of the upper enclosure member 138. Either a frame 140, as shown, or the circuit board 20 of electronic device 14, is captured between the flange 142 of the channel 122 and the panel 136 of the upper enclosure member 138. As in the embodiment described in connection with FIGS. 1 through 5, channel 122 is nested within channel 134 to complete and secure the assembly.

It will be seen that the present invention attains the objects and advantages summarized above, namely: Enables the economical manufacture of effectively enclosed personal computer cards; provides PC Card enclosures of accurate dimensions, and requisite strength and rigidity to maintain structural integrity and dimensional stability throughout an extended service life; simplifies the assembly and completion of PC Cards; provides added flexibility in the design and construction of PC Cards for enhanced information storage and processing capabilities; accommodates a wide variety of PC Card configurations while providing enhanced strength, rigidity and electrical shielding integrity; facilitates high speed production and assembly techniques for the economical manufacture of PC Cards in large numbers of consistent high quality.

It is to be understood that the above detailed description of preferred embodiments of the invention is provided by way of description only. Various details of design, construction and procedure may be modified without departing from the true spirit and scope of the invention, as set forth in the appended claims.

The embodiments of the invention in which an exclusive property or privilege is claimed are defined as follows:

1. An enclosure for a personal computer card in which an electronic device is housed within the enclosure for convenient interconnection with a host apparatus, the personal computer card having a generally rectangular plan configuration including longitudinal sides and lateral ends, and a predetermined thickness along the longitudinal sides and lateral ends of the personal computer card, and the enclosure having longitudinal sides and lateral ends corresponding to the longitudinal sides and lateral ends of the personal computer card, and a thickness along the longitudinal sides and lateral ends of the enclosure equal to the corresponding predetermined thickness of the personal computer card, the enclosure comprising:

first and second shell-like members, each shell-like member having a generally rectangular plan configuration and including a panel, longitudinal side edges corresponding to the longitudinal sides of the enclosure, and lateral end edges corresponding to the lateral ends of the enclosure;

channels integral with the panel of at least the second shell-like member and extending longitudinally along the longitudinal side edges of the second shell-like member, the channels each having an external channel width extending altitudinally a first distance equal to the thickness of the enclosure along the longitudinal sides of the enclosure, and the channels each having an internal channel width; and side walls integral with the panel of at least the first shell-like member and extending longitudinally along the longitudinal side edges of the first shell-like member, the side walls each having a side wall width extending altitudinally a second distance;

the first distance and the second distance, and the relative locations of the internal channel width and the side wall width being such that upon juxtaposition of the first and second shell-like members in opposed arrangement, the panels confront one another and the side walls of the first shell-like member are nested within the corresponding channels of the second shell-like member to secure the first and second shell-like members together with the respective panels opposed to one another and spaced apart altitudinally to accommodate the electronic device between the opposed panels and to maintain the thickness along the longitudinal sides of the enclosure.

2. The invention of claim 1 wherein the side wall width of the first shell-like member is essentially the same as the internal channel width of the second shell-like member.

3. The invention of claim 1 wherein the first shell-like member includes further channels integral with the corresponding panel and extending along the longitudinal side edges of the first shell-like member, the side walls extending along the further channels.

4. The invention of claim 3 wherein the further channels have an external channel width essentially the same as to the internal channel width of the channels of the second shell-like member.

5. The invention of claim 3 wherein the further channels have an external channel width less than the internal channel width of corresponding channels of the second shell-like member, the difference between the external channel width of the channels of the first shell-like member and the internal channel width of the corresponding channels of the second shell-like member enabling securement of the electronic device altitudinally between the corresponding channels of the first and second shell-like members.

6. The invention of claim 1 wherein the side walls of the first shell-like member are offset from the panel of the first shell-like member in an altitudinal direction toward the panel of the second shell-like member, and the channels of the second shell-like member each include a flange seated within the offset when the side walls of the first shell-like member are nested within the corresponding channels of the second shell-like member.

7. The invention of claim 1 wherein the first and second shell-like members are joined along corresponding end edges in an integral structure.

8. The invention of claim 7 wherein the integral structure is a unitary member of sheet material.

9. The invention of claim 8 wherein the sheet material is stainless steel.

10. The invention of claim 8 wherein the first shell-like member includes further channels integral with the corresponding panel and extending along the longitudinal side edges of the first shell-like member, the side walls extending along the further channels.

11. The invention of claim 10 wherein the further channels have an external channel width essentially the same as the internal channel width of the corresponding channels of the second shell-like member.

12. The invention of claim 10 wherein the further channels have an external channel width less than the internal channel width of corresponding channels of the second shell-like member, the difference between the external channel width of the channels of the first shell-like member and the internal channel width of the corresponding channels of the second shell-like member enabling securement of the electronic device altitudinally between the corresponding channels of the first and second shell-like members.

13. The invention of claim 10 wherein the side walls of the first shell-like member are offset from the panel of the first shell-like member in an altitudinal direction toward the panel of the second shell-like member, and the channels of the second shell-like member each include a flange seated within the offset when the side walls of the first shell-like member are nested within the corresponding channels of the second shell-like member.

14. The invention of claim 10 including still further channels extending along corresponding end edges of the respective first and second shell-like members, the still further channels extending altitudinally along distances enabling nesting of corresponding still further channels upon said juxtaposition of the first and second shell-like members in opposed arrangement.

* * * * *